(12) United States Patent
Oh et al.

(10) Patent No.: US 8,705,592 B2
(45) Date of Patent: Apr. 22, 2014

(54) DATA TRANSMISSION APPARATUS, DATA RECEPTION APPARATUS, AND DATA TRANSMISSION METHOD

(75) Inventors: Myeong-Hoon Oh, Daejeon (KR); Chi-Hoon Shin, Daejeon (KR); Sung-Nam Kim, Daejeon (KR); Seong-Woon Kim, Gyeryong-si (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/554,327

(22) Filed: Jul. 20, 2012

(65) Prior Publication Data

US 2013/0259166 A1    Oct. 3, 2013

(30) Foreign Application Priority Data

Mar. 30, 2012  (KR) .................. 10-2012-0032855

(51) Int. Cl.
*H04L 25/00* (2006.01)
*H04B 3/00* (2006.01)
*G01R 31/08* (2006.01)

(52) U.S. Cl.
USPC ............................ 375/216; 375/258; 370/249

(58) Field of Classification Search
USPC .................. 375/216, 258; 370/249
See application file for complete search history.

(56) References Cited

U.S. PATENT DOCUMENTS

| 5,379,289 | A | * | 1/1995 | DeSouza et al. | 370/230 |
| 5,390,183 | A | * | 2/1995 | Friedrich et al. | 370/249 |
| 5,541,957 | A | * | 7/1996 | Lau | 375/258 |
| 6,195,397 | B1 | * | 2/2001 | Kwon | 375/288 |
| 2006/0236351 | A1 | * | 10/2006 | Ellerbrock et al. | 725/81 |
| 2008/0123765 | A1 | | 5/2008 | Oh et al. | |
| 2008/0151973 | A1 | * | 6/2008 | Calvin | 375/216 |
| 2009/0097588 | A1 | * | 4/2009 | El-Agha et al. | 375/295 |
| 2010/0135430 | A1 | * | 6/2010 | Oh et al. | 375/295 |
| 2010/0188014 | A1 | * | 7/2010 | Lundstrum et al. | 315/291 |

FOREIGN PATENT DOCUMENTS

KR   10-0447217    4/2005
KR   10-2010-0060616   6/2010

OTHER PUBLICATIONS

M. Dean et al., "Efficient Self-Timing with Level-Encoded 2-Phase Dual-Rail (LEDR)", Proc. Of Advanced Research in VLSI, 1991, pp. 55-70.

* cited by examiner

*Primary Examiner* — Leon-Viet Nguyen
*Assistant Examiner* — Sarah Hassan
(74) *Attorney, Agent, or Firm* — Staas & Halsey LLP

(57) ABSTRACT

Disclosed herein are a data transmission apparatus, a data reception apparatus, and a data transmission method. The data transmission apparatus, the data reception apparatus, and the data transmission method are capable of simplifying the circuit structure of a decoder because an assumption of the time related to a request signal and a data signal is not necessary and an additional logic for generating a clock signal for the decoder is not necessary by using a Finite State Machine (FSM) logic without storing a state via a delay device.

16 Claims, 8 Drawing Sheets

DATA TRANSMISSION APPARATUS, DATA RECEPTION APPARATUS, AND DATA TRANSMISSION METHOD

CROSS REFERENCE TO RELATED APPLICATION

This application claims the benefit of Korean Patent Application No. 10-2012-0032855, filed on Mar. 30, 2012, which is hereby incorporated by reference in its entirety into this application.

BACKGROUND OF THE INVENTION

1. Technical Field

The present invention relates generally to a data transmission system and a data transmission method and, more particularly, to a data transmission system and a data transmission method which transfer information using a Delay Insensitive (DI) data transmission method.

2. Description of the Related Art

With the development of semiconductor processing technology and integrated circuit design technology, a current integrated circuit system is chiefly designed using a System-on-Chip (SoC) method which implements an integrated circuit system in a single chip.

Recently, with the further development of semiconductor processing technology and integrated circuit design technology, there has been a tendency in which the number of elements integrated into a single chip has gradually increased. Accordingly, the wiring structure of transmission wires designed in a single chip is becoming more complicated. Accordingly, if an integrated circuit system is implemented using the SoC design method, the number of transmission wires, the length of the transmission wires, and signal delay due to interference between the transmission wires are design factors that must be significantly taken into consideration to accomplish an appropriate operation of the chip.

Meanwhile, when a synchronous design method using a global clock is applied to an integrated circuit system implemented using the SoC method, there occur clock skew and jitter attributable to an increase in clock speed and the transmission delay of data attributable to an increase in the number of transmission wires and the length of the transmission wires. These problems can be overcome by applying an asynchronous design method to the integrated circuit system implemented using the SoC method.

The asynchronous design method can overcome the above problems of the synchronous design method by performing data transmission based on a DI data transmission method supporting a handshake protocol insensitive to delay time without using a global clock. The asynchronous design method is problematic, however, in that the design of all circuits is complicated and CAD tools for the asynchronous design are insufficient.

Research into a Globally Asynchronous Locally Synchronous (GALS) system has been actively conducted to provide a scheme that is capable of solving the problems of the synchronous design method and the problems of the asynchronous design method at the same time.

The GALS system basically does not use a global clock, and includes a number of LS modules operating in response to independent clocks. Data transmission between the LS modules is performed in compliance with an asynchronous handshake protocol.

As described above, the GALS system solves problems, such as clock skew and jitter, because it does not use a global clock, and secures stable data transmission because data transmission between the LS modules operating with different timing is performed using a DI data transmission method.

In the DI data transmission method, data is represented using an encoding method, such as dual-rail or 1-of-4 encoding method, and a 4-phase handshaking protocol similar to that of the existing synchronous design method is used. However, the 4-phase handshaking protocol must include a space state for informing of data validity not related to data transmission, and the space state has the same latency as data. In a GALS system in which the transmission of data via interconnection extended due to an increased die size is frequent, a 2-phase handshaking protocol method without the space state is more efficient than the 4-phase handshaking protocol method.

Unlike in the existing dual-rail-based 2-phase protocol in which the transmission of data "0" and the transmission of data "1" in two wires are encoded using the state changes of the respective wires, in the dual-rail-based 2-phase handshaking protocol, also known as Level-Encoded 2-phase Dual-Rail (LEDR), the transmission of data "0" is encoded using data in one wire and the transmission of data "1" is encoded using a phase shift in the other wire, and vice versa. That is, the data "0" and the data "1" are encoded as levels, not state changes, in one wire, and pieces of data are distinguished from each other based on a change in the other wire. Consequently, the exclusive-OR (XOR) value of the two wires is changed for each data transmission, and the validity of data is determined by detecting the change. Accordingly, the dual-rail-based 2-phase handshaking protocol has better performance than the existing dual-rail-based 2-phase protocol and can reduce design complexity because data decoding is not required. However, the dual-rail-based 2-phase handshaking protocol is disadvantageous in terms of performance, power consumption, and design complexity corresponding to the number of increased wires because 2N+1 wires are required for the transmission of N-bit data.

Conventional data transmission techniques include a signal transmission technique that is capable of reducing an area occupied by wires by simultaneously sending several different types of signals via one wire between a plurality of functional blocks within an integrated circuit. According to this technique, theoretically, when N-bit data is transmitted, $2^N$ voltage values in triangular pulse form are encoded and send in one wire, and a reception circuit restores data by detecting the $2^N$ voltage values. In this case, the overall area of an integrated circuit may be reduced because the number of required wires is reduced. However, the complexity of the reception circuit may be greatly increased because the number of logics that must be decoded increases due to an increase in the number of voltage values that may be encoded in a wire, and thus a decrease in the number of wires is limited. Furthermore, in a multi-valued logic circuit technology using voltage used in the conventional technology, the noise margin characteristic of the voltage may be deteriorated in a receiving circuit because supply voltage within the integrated circuit is gradually lowered. Furthermore, the multi-valued logic circuit technology is unable to be applied to a GALS system because it does not provide a function of supporting a handshake protocol required for DI transmission.

In order to support DI transmission and reduce the number of wires, a protocol using a ternary encoding method is being researched. A data transmission technology using the ternary encoding method is not influenced by the noise margin of the supply voltage because a current mode-type multi-valued logic circuit is used. Furthermore, in this technology, a circuit may be designed using N+1 wires for the transmission of data of N bits because three types of logic states may be represented in one wire.

Furthermore, in order to compensate for a high constant current consumption characteristic occurring in the conventional current mode-type DI data transmission method, research capable of significantly reducing power consumption in a standby state using a new data encoding method had been carried out.

However, the two DI data transmission methods using current mode circuits are disadvantageous in that they may have half of performance, compared to the 2-phase DI data transmission method, such as LEDR, because it is basically based on the 4-phase data transmission method.

In order to compensate for the disadvantage of the DI data transmission methods using current mode circuits, a 2-phase signaling scheme using a current mode DI transmission method was proposed. In this method, in order to compare current input data with next data, an encoder assumes the synchronization between an input request signal and a data signal, a delay device is inserted into the data signal, and delayed current data is extracted from a next input request signal. However, when designing an encoder only under the synchronization assumption that a data signal must be stabilized prior to an input request signal in an asynchronous signal environment, a designer must know the greatest time difference between the input request signal and the data signal and the shortest cycle time of the input request signal in order to determine the delay time of a delay device. This may make it very difficult to determine the delay time of the delay device, or this may mean that the functionality of the encoder cannot be ensured because the desired delay time of the delay device cannot be found in some case (in the case where the greatest time difference between the input request signal and the data signal>the shortest cycle time of the request signal). Furthermore, in the decoder using this technology, a D flip-flop is used in order to restore a data signal, and an additional logic for producing a point of time at which the D flip-flop captures data, that is, the clock signal of the D flip-flop, is required. Furthermore, this technology does not suggest a method of reducing latency in transmission via a long wire, such as the insertion of a buffer, which is commonly used in the transmission of voltage mode binary data.

SUMMARY OF THE INVENTION

An object of the present invention is to provide a data transmission apparatus, a data reception apparatus, and a data transmission method, which are capable of simplifying the circuit structure of a decoder because an assumption of the time related to a request signal and a data signal is not necessary and an additional logic for generating a clock signal for the decoder is not necessary by using a Finite State Machine (FSM) logic without storing a state via a delay device.

In order to accomplish the above object, the present invention provides a data transmission apparatus, including a data transmitter for generating a request signal and a data signal having a Non-Return-to-Zero (NRZ) format that is divided into a binary value "0" and a binary value "1" on a basis of a transition point of the request signal; and an encoder for receiving the request signal and the data signal and converting the binary value "0," the binary value "1" and a current binary value identical with a previous binary value into respectively different current levels, by performing an operation on the request signal and the data signal using a Finite State Machine (FSM) which is generated by allocating a LOW state indicative of the binary value "0," a HIGH state indicative of the binary value "1" and a MIDDLE state indicative of the current binary value identical with the previous binary value to specific state signals.

The respectively different current levels may include a first current level, a second current level lower than the first current level, and a third current level lower than the first current level but higher than the second current level; and the encoder may output the first current level when sending the binary value "1," output the second current level when sending the binary value "0," and output the third current level when sending the data signal having the current binary value identical with the previous binary value.

The encoder may include a data state machine for outputting a state signal corresponding to a current state and corresponding to one of the LOW state indicative of the binary value "0," the HIGH state indicative of the binary value "1," and the MIDDLE state indicative of the current binary value identical with the previous binary value using the data signal and the request signal; and a current generator for outputting one of the first to third current levels in response to the state signal corresponding to the current state.

The data transmission apparatus may further include a current addition/subtraction prediction unit for generating a charging pulse signal or a discharging pulse signal based on a response signal sent in response to the request signal, the data signal, the state signal corresponding to the current state, and a request signal and a data signal restored by the data reception apparatus; and a current addition/subtraction unit for controlling current generated by the current generator by previously performing charging or discharging in response to the charging pulse signal or the discharging pulse signal.

In order to accomplish the above object, the present invention provides a data reception apparatus, including a decoder for receiving an input current signal encoded using an FSM generated by allocating a LOW state indicative of the binary value "0," a HIGH state indicative of the binary value "1," and a MIDDLE state indicative of a current binary value identical with a previous binary value to specific state signals, generating voltage values corresponding to the three types of logic states using internally generated reference current, and restoring a request signal and a data signal based on the generated voltage values; and a data receiver for sending a response signal to a receiving side in response to the restored request signal and the restored data signal.

The restored data signal may have an NRZ format that is divided into the binary value "0" and the binary value "1" on a basis of a transition point of the restored request signal.

The input current signal may have one of a first current level corresponding to a HIGH state, a second current level corresponding to a LOW state, and a third current level corresponding to the MIDDLE state; and the second current level may be lower than the first current level, and the third current level may be lower than the first current level but higher than the second current level.

In order to accomplish the above object, the present invention provides a data transmission method, including receiving a request signal and a data signal having an NRZ format that is divided into a binary value "0" and a binary value "1" on a basis of a transition point of the request signal; performing an operation on the request signal and the data signal using an FSM generated by allocating a LOW state indicative of the binary value "0," a HIGH state indicative of the binary value "1," and a MIDDLE state indicative of a current binary value identical with a previous binary value to specific state signals, and coding the binary value "1" into a first current level, coding the binary value "0" into a second current level lower than the first current level, and coding the current binary value identical with the previous binary value into a third current level lower than the first current level but higher than the second current level based on results of the operation; receiving any one current level of the first to third current levels; detecting the any one current level and generating first and second logic voltages based on the detected current level; and restoring the data signal and the request signal by performing an operation on the first and second logic voltages.

The any one current level may be received according to a 2-phase DI data transmission method.

BRIEF DESCRIPTION OF THE DRAWINGS

The above and other objects, features, and advantages of the present invention will be more clearly understood from the following detailed description taken in conjunction with the accompanying drawings, in which.

DESCRIPTION OF THE PREFERRED EMBODIMENTS

Figure 1:
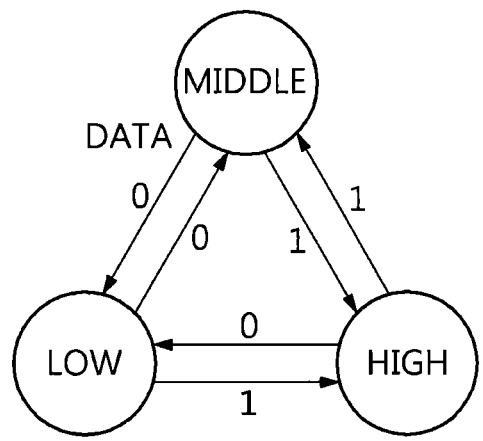
FIG. 1 is a diagram showing variations in the logic state of a value encoded according to a 2-phase ternary encoding method applied to a data transmission apparatus, a data reception apparatus, and a data transmission method according to an embodiment of the present invention.

The present invention will be described in detail below with reference to the accompanying drawings. In the following description, detailed descriptions of well-known functions or configurations which would unnecessarily obscure the gist of the present invention will be omitted. The embodiments of the present invention are provided to more completely describe the present invention to those having ordinary knowledge in the related art. Accordingly, the shapes or sizes of elements in the drawings may be exaggerated to provide clearer descriptions.

FIG. 1 is a diagram showing variations in the logic state of a value encoded according to a 2-phase ternary encoding method applied to a data transmission apparatus, a data reception apparatus, and a data transmission method according to an embodiment of the present invention.

Referring to FIG. 1, in the 2-phase ternary encoding method applied to the data transmission apparatus, the data reception apparatus, and the data transmission method according to the embodiment of the present invention, a data signal is formatted according to a Non-Return to Zero (NRZ) method without a space state in order to represent a binary value "0" and a binary value "1." The data signal formatted according to the NRZ method is encoded as three types of logic states.

For example, a data signal is encoded as a HIGH state when a binary value "1" is sent, and a data signal is encoded as a LOW state when a binary value "0" is sent.

If the binary value of the current data signal that is identical with the binary value of a previous data signal is sent, a current data signal is encoded as a MIDDLE state. It will be apparent that a data signal indicative of a binary value "0" may be encoded as a HIGH state and a data signal indicative of a binary value "1" may be encoded as a LOW state. In this specification, however, it is assumed that a data signal indicative of a binary value "0" is encoded as a LOW state and a data signal indicative of a binary value "1" is encoded as a HIGH state.

In the present invention, encoded values indicative of the three types of logic states HIGH, MIDDLE, and LOW are converted into three respectively different current levels, so that they can be sent to a receiving side. For example, a HIGH state may be represented by a first current level, and a LOW state may be represented by a second current level which is lower than the first current level. The MIDDLE state may be represented by a third current level which is lower than the first current level but is higher than the second current level. Here, if a data signal indicative of a binary value "0" is encoded as a HIGH state and a data signal indicative of a binary value "1" is encoded as a LOW state, the data signal indicative of the binary value "0" may be converted into the first current level and the data signal indicative of the binary value "1" may be converted into the third current level.

In the 2-phase ternary encoding method applied to the data transmission apparatus, the data reception apparatus, and the data transmission method according to the embodiments of the present invention, a data signal can be transmitted after a small number of signal conversions because there is no space state, unlike in a conventional 4-phase ternary encoding method.

Figure 2:
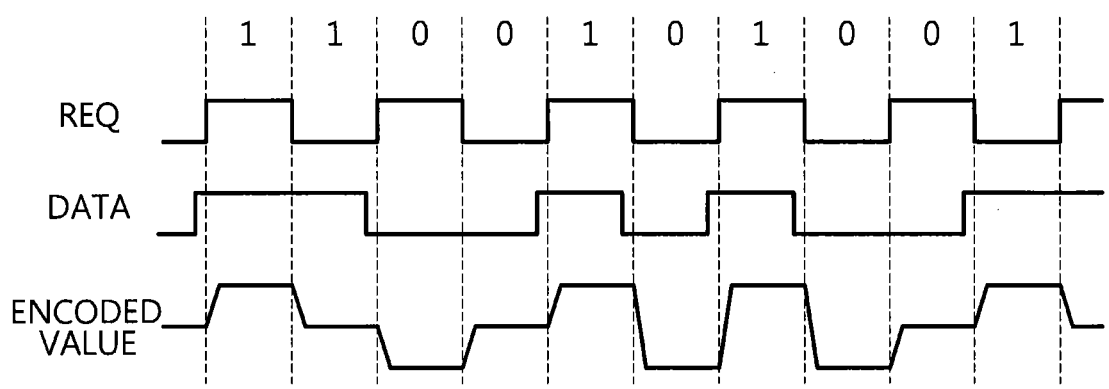
FIG. 2 is a diagram showing examples of values which are encoded according to the 2-phase ternary encoding method applied to the data transmission apparatus, the data reception apparatus, and the data transmission method according to an embodiment of the present invention.

FIG. 2 is a diagram showing examples of values which are encoded according to the 2-phase ternary encoding method applied to the data transmission apparatus, the data reception apparatus, and the data transmission method according to the embodiment of the present invention.

Referring to FIG. 2, values which are encoded according to the 2-phase ternary encoding method applied to the data transmission apparatus, the data reception apparatus, and the data transmission method according to the embodiment of the present invention are sent to a receiving side according to a 2-phase bundled data transmission method.

In the 2-phase bundled data transmission method used in the data transmission apparatus, the data reception apparatus, and the data transmission method according to the embodiment of the present invention, a request signal REQ for extracting the binary values "1" and "0" of a data signal DATA, together with the data signal DATA, is necessary, as shown in FIG. 2. That is, the data signal DATA is extracted as the binary value "1" and the binary value "0" on the basis of the time at which the request signal REQ transitions. Consequently, in the bundled data transmission method, the request signal REQ for sampling the data signal DATA is necessary.

In order for the data signal DATA to be stably transmitted to a receiving side, the data signal DATA should be stably sampled in response to the request signal REQ. Accordingly, in the bundled data transmission method, after the data signal DATA is stabilized, the request signal REQ is asserted, as shown in FIG. 2. That is, a point of time at which the data signal DATA rises is set to a point of time which is earlier than a point of time at which the request signal REQ rises.

FIG. 2 shows examples of values which are encoded using the serial consecutive data signal 1 1 0 0 1 0 1 0 0 1 and the request signal REQ in a 2-phase bundled data transmission method environment.

As described with reference to FIG. 1, if an encoded value is in a HIGH state, the data signal DATA indicative of the binary value "1" is sent to the receiving side as the first current level "2I." If the encoded value is in a LOW state, the data signal DATA indicative of the binary value "0" is sent to the receiving side as the second current level "I" which is lower than the first current level "2I."

Furthermore, if the encoded value is in the MIDDLE state, the data signal DATA indicative of the same binary value as a previous binary value is sent to the receiving side as the third current level "I," which is lower than the first current level "2I" but higher than the second current level "O."

As described above, in the present invention, in order to implement the ternary encoding method, the three types of states HIGH, MIDDLE, and LOW are converted into respectively different current levels, and are then sent to the receiving side. Accordingly, in the present invention, a multi-valued logic circuit using a current mode for converting the three types of states HIGH, MIDDLE, and LOW into the respectively different current levels is adopted.

The multi-valued logic circuit is of a voltage mode type, and a current mode type which is adopted in the present invention.

If the voltage mode-type multi-valued logic circuit is adopted in the present invention, the first voltage level "2 V," the second voltage level "0 V" or GND lower than the first voltage level "2 V," and the third voltage level "V" lower than the first voltage level but higher than the second voltage level may be used in order to represent the three types of states of HIGH, MIDDLE, and LOW.

It is however not preferred that the voltage mode-type multi-valued logic circuit be used in order to represent the three types of states.

As described in Description of the Related Art, with the development of semiconductor process technology, supply voltage within an integrated circuit is gradually lowered. In this situation, the use of the voltage mode-type multi-valued logic circuit deteriorates the noise margin of the voltage at a reception-side circuit. That is, the noise margins between the three levels become narrower in the situation in which supply voltage is lowered.

In contrast, wide noise margins can be secured because the current mode-type multi-valued logic circuit may control the amount of current irrespective of supply voltage. Furthermore, power consumption can be reduced because the current has a smaller swing width than the voltage. Accordingly, in order to represent the three types of states of HIGH, MIDDLE, and LOW, the current mode-type multi-valued logic circuit is adopted in the present invention.

The data transmission apparatus, the data reception apparatus, and the data transmission method using a DI data transmission method according to embodiments of the present invention are described in detail on the basis of the contents described with reference to FIGS. 1 and 2.

Figure 3:
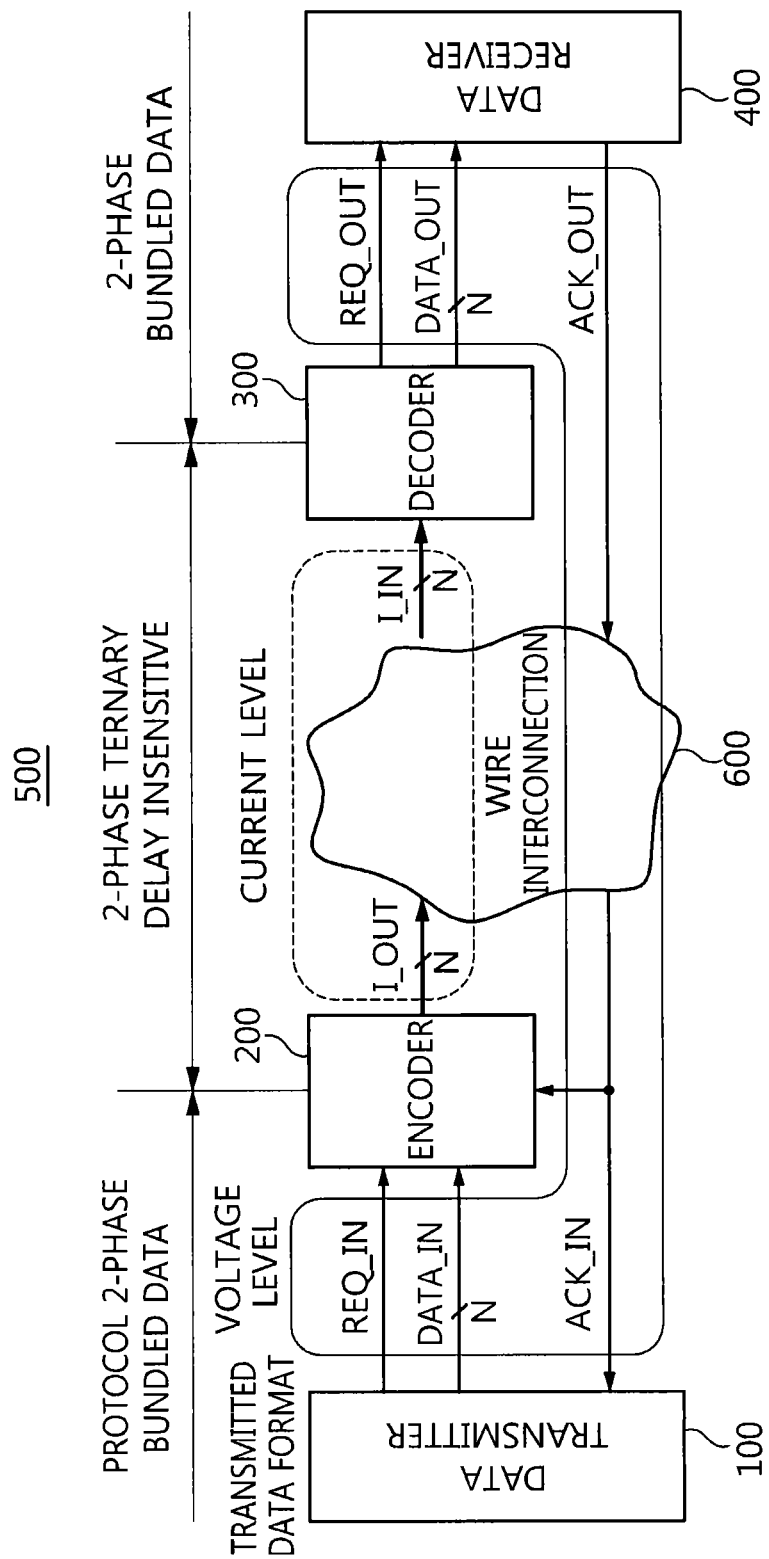
FIG. 3 is a block diagram showing the internal configuration of the data transmission apparatus and the data reception apparatus according to an embodiment of the present invention.

FIG. 3 is a block diagram showing the internal configuration of the data transmission apparatus and the data reception apparatus according to an embodiment of the present invention.

Referring to FIG. 3, a data transmission system 500 including the data transmission apparatus and the data reception apparatus according to the embodiment of the present invention includes a data transmitter 100, an encoder 200, a decoder 300, and a data receiver 400.

The data transmission apparatus according to an embodiment of the present invention may include the data transmitter 100 and the encoder 200, and the data reception apparatus according to an embodiment of the present invention may include the decoder 300 and the data receiver 400.

The data transmitter 100 generates an input voltage-level request signal REQ_IN, and an input NRZ-type data signal DATA_IN having a voltage level divided into the binary value "0" or the binary value "1" on the basis of and a point of time at which the input request signal REQ_IN transitions. The generated input request signal REQ_IN and the input NRZ-type data signal DATA_IN are sent to the encoder 200 according to the 2-phase bundled data transmission method which supports a 2-phase handshake protocol.

The encoder 200 encodes the binary values of the input data signal DATA_IN into an output current signal I_OUT, including the three types of current levels, in response to the input data signal DATA_IN and the input request signal REQ_IN received from the data transmitter 100.

In detail, the encoder 200 outputs the output signal I_OUT of the first current level when the input data signal DATA_IN indicative of the binary value "1" is received from the data transmitter 100, outputs the output signal I_OUT of the second current level lower than the first current level when the input data signal DATA_IN indicative of the binary value "0" is received from the data transmitter 100, and outputs the output signal I_OUT of the third current level lower than the first current level but higher than the second current level when the input data signal DATA_IN having a current binary value identical with the previous binary value is received from the data transmitter 100. The output signal I_OUT output from the encoder 200 is sent to the decoder 300 interconnected (600) to the encoder 200 via a wire, according to the 2-phase DI data transmission method.

The decoder 300 receives the output current-level current signal I_OUT from the encoder 200 as the input current-level signal I_IN, and restores the input request signal REQ_IN and the input voltage-level data signal DATA_IN from the input current-level signal I_IN. The decoder 300 sends the input request signal REQ_IN, restored according to the 2-phase bundled data transmission method, to the data receiver 400 as an output request signal REQ_OUT, and sends the input data signal DATA_IN, restored according to the 2-phase bundled data transmission method, to the data receiver 400 as an output data signal DATA_OUT.

The data receiver 400 generates an output voltage-level response signal ACK_OUT in response to the output data signal DATA_OUT and the output request signal REQ_OUT received from the decoder 300, and the data transmitter 100 receives the generated output response signal ACK_OUT as the response signal ACK_IN. Once the data transmitter 100 has received the input response signal ACK_IN, one cycle is terminated.

In summary, the encoder 200 converts an input request signal and an input data signal in two-phase form and binary voltage mode into current levels. The three logic states of HIGH, MIDDLE, and LOW are allocated to the converted current levels in a ternary form. Unlike in the prior art, in the present invention, a space state is not allocated to the converted current levels. Instead, the MIDDLE state indicative of a logic state having a current binary value identical with a previous binary value is allocated to the current levels. This means that the data transmission apparatus using the 2-phase DI data transmission method according to the present invention is superior to a conventional data transmission apparatus using a 4-phase DI data transmission method in terms of data transmission efficiency in that only valid data is transferred. The decoder 300 restores the current levels generated by the encoder 200, to the original input request signal and the original input data signal.

Meanwhile, the data transmitter 100 and the data receiver 400 use the 2-phase bundled data protocol as the LS module of a GALS system in data communication between the data transmitter 100 and the data receiver 400. The encoder 200 and the decoder 300 do not include buffer-type storage means for storing signals transmitted between the data transmitter 100 and the data receiver 400. Accordingly, the input response signal ACK_IN output from the data receiver 400 is sent to the data transmitter 100 in the form of a binary voltage.

Figure 4:
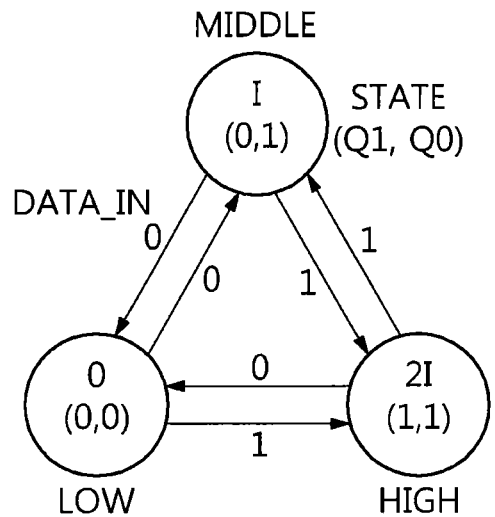
FIG. 4 is a state transition diagram of the encoder of the data transmission apparatus according to an embodiment of the present invention.

FIG. 4 is a state transition diagram of the encoder 300 of the data transmission apparatus according to an embodiment of the present invention.

As shown in FIG. 1, since a point of time at which the data signal transitions is a point of time at which the request signal rises or falls, the point of time at which the data signal transitions may be implemented in the form of an FSM by using a dual edge-triggered flip-flop. That is, as shown in FIG. 4, if the three types of states varying in response to the input data signal DATA_IN are allocated to parameter values (Q1, Q0), that is, state signals, the FSM may be formed. Table 1 shows a state transition table based on the state transition diagram of FIG. 4.

TABLE 1

| CURRENT STATE (Q1, Q0) | INPUT DATA SIGNAL DATA_IN | NEXT STATE D1, D0 |
|---|---|---|
| LOW (0, 0) | 0 | (0, 1) |
| | 1 | (1, 1) |
| MIDDLE (0, 1) | 0 | (0, 0) |
| | 1 | (1, 1) |
| HIGH (1, 1) | 0 | (0, 0) |
| | 1 | (0, 1) |
| (1, 0) | 0 | X |
| | 1 | X |

Figure 5:
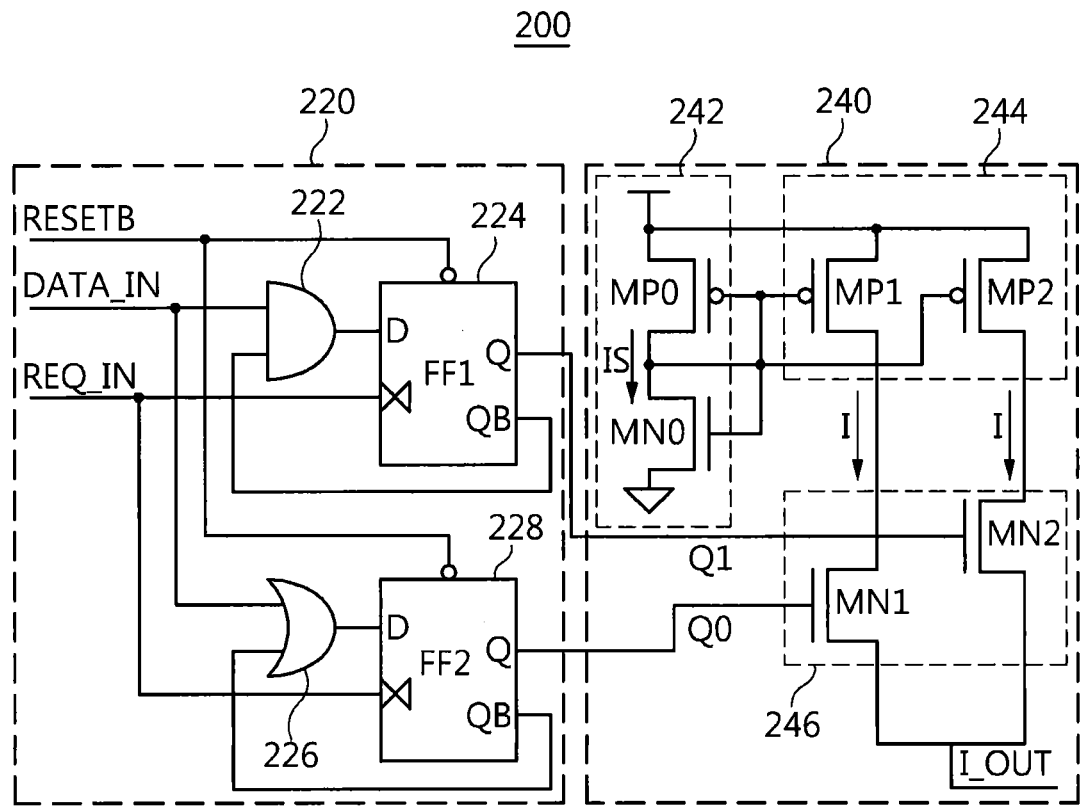
FIG. 5 is a circuit diagram showing an example of the internal configuration of the encoder of the data transmission apparatus according to an embodiment of the present invention.

Here, in a Karnaugh map based on Table 1, the equation "D1=DATA_IN*!Q1, D0=DATA_IN+!Q0" can be obtained. FIG. 5 shows an example of the encoder which satisfies a state transition diagram, such as that shown in FIG. 4.

FIG. 5 is a circuit diagram showing an example of the internal configuration of the encoder 200 of the data transmission apparatus according to an embodiment of the present invention.

The encoder 200 of the data transmission apparatus according to the embodiment of the present invention receives a request signal and a data signal from the data transmitter 100, allocates a LOW state indicative of the binary value "0," a HIGH state indicative of the binary value "1," and a MIDDLE state having a current binary value identical with a previous binary value to a specific state signal, and converts current binary values identical with the binary value "0," the binary value "1," and the previous binary value into respectively different current levels, by performing an operation on the received request signal and the received data signal using the generated FSM.

Referring to FIG. 5, the encoder 200 includes a data state machine 220 and a current generator 240. The data state machine 220 generates a state signal in a voltage form, indicative of the current state of the three types of states, in response to an input request signal REQ_IN and an input data signal DATA_IN received from the data transmitter 100. The current generator 240 generates the first to third current levels "2I," "0," and "I" in response to the state signal of the data state machine 220.

More particularly, the data state machine 220 includes a first flip-flop FF1 222, a first AND gate 224, a first OR gate 226, and a second flip-flop FF2 228.

The first AND gate 222 performs an AND operation on the input data signal DATA_IN and the inverting output signal of the first flip-flop 224, and applies the results of the AND operation performed on the input data signal DATA_IN and the inverting output signal to the input terminal of the first flip-flop 224.

The first flip-flop 224 outputs the first state signal Q1 of the state signals Q1 and Q0 corresponding to the current state by sampling the results of the AND operation performed on the input data signal DATA_IN and the inverting output signal of the first flip-flop 224, in response to a point of time at which the input request signal REQ_IN transitions. For this purpose, the first flip-flop 224 may operate in accordance with the dual edge-triggered method. That is, the first flip-flop 224 samples the input data signal DATA_IN at the rising edge (or leading edge) and falling edge (or trailing edge) of the input request signal REQ_IN. The results of the AND operation performed on the input data signal DATA_IN and the inverting output signal of the first flip-flop 224 are applied to the input terminal of the first flip-flop 224, the input request signal REQ_IN is applied to the clock terminal of the first flip-flop 224, and an inverted reset signal RESETB for resetting the first flip-flop 224 is applied to the reset terminal of the first flip-flop 224. The first state signal Q1 of the state signals Q1 and Q0, corresponding to the current state sampled at the rising and falling edges of the input request signal REQ_IN, is output from the output terminal of the first flip-flop 224. Here, the clock terminal of the first flip-flop 224 is indicated by a symbol, such as "??," in order to represent the dual edge-triggered method.

The first OR gate 226 performs an OR operation on the input data signal DATA_IN and an inverting output signal of the second flip-flop 228, and applies the results of the OR operation performed on the input data signal DATA_IN and the inverting output signal of the second flip-flop 228, to the input terminal of the second flip-flop 228.

The second flip-flop 228 may operate according to the same dual edge-triggered method as the first flip-flop 224. The second flip-flop 228 outputs the second state signal Q0 of the state signals Q1 and Q0, corresponding to the current state, by sampling the results of the OR operation performed on the input data signal DATA_IN and the inverting output signal of the second flip-flop 228 on the basis of a point of time at which the request signal REQ_IN transitions. The results of the OR operation on the input data signal DATA_IN and the inverting output signal of the second flip-flop 228 are input to the input terminal of the second flip-flop 228, the input request signal REQ_IN is input to the clock terminal of the second flip-flop 228, and the second state signal Q0 of the state signals Q1 and Q0 corresponding to the current state, respectively sampled at the rising and falling edges of the input request signal REQ_IN, is output from the output terminal of the second flip-flop 228.

The current generator 240 outputs any one of the first to third current levels "2I," "0," and "I" in response to the state signals Q1 and Q0 corresponding to the current state.

More particularly, the voltage-to-current converter 240 includes a current source 242 for the encoder, a current mirror circuit 244 for the encoder, and an output circuit 246.

The current source 242 for the encoder includes a PMOS transistor MP0 and an NMOS transistor MN0. The PMOS transistor MP0 and the NMOS transistor MN0 are connected in series between a power source and a ground through a common node that connects the drain of the PMOS transistor MP0 and the drain of the NMOS transistor MN0. In accordance with the current source 242 for the encoder, the voltage between the drain and source of the PMOS transistor MP0 is identical with the voltage between the gate and source of the PMOS transistor MP0. Furthermore, the voltage between the drain and source of the NMOS transistor MN0 is identical with the voltage between the gate and source of the NMOS transistor MN0. Accordingly, the PMOS transistor MP0 and the NMOS transistor MN0 always operate in a saturation region, and thus constant current Is flows through the common node.

The current mirror circuit current mirror circuit 244 for the encoder generates the third current level I using the constant current Is. More particularly, the current mirror circuit 244 includes first and second PMOS transistors MP1 and MP2. The constant current Is generated by the current source 242 for the encoder is copied to each of the drain of the first PMOS transistor MP1 and the drain of the second PMOS transistor MP2. Here, the amount of current of the drain may vary depending on the size of each of the first PMOS transistor MP1 and the second PMOS transistor MP2. In an embodiment, the second PMOS transistor MP2 has the same size as the first PMOS transistor MP1. Accordingly, the amount of current corresponding to the third current level I is copied to both the drains of the first PMOS transistor MP1 and the second PMOS transistor MP2. Here, the size means a ratio W/L of the channel width W to the channel length L of the transistor. As described above, in the current mirror circuit 244 for the encoder of the data transmission apparatus according to the embodiment of the present invention, the output of each of the PMOS transistors MP1 and MP2 may be designed as the third current level I. Accordingly, an area of the current mode circuit may be reduced, and the FSM circuit has an advantage in terms of the size.

The output circuit 246 selectively outputs any one of the first to third current levels in response to the state signals Q1 and Q0 corresponding to the current state. More particularly, the output circuit 246 includes a first NMOS transistor MN1 and a second NMOS transistor MN2. The first NMOS transistor MN1 includes a gate to which the first state signal Q1 of the state signals Q1 and Q0 corresponding to the current state is applied, a drain to which the third current level I is applied, and a source coupled to the output terminal of the first PMOS transistor MP1 from which the third current level I is output. The second NMOS transistor MN2 includes a gate to which the second state signal Q0 of the state signals Q1 and Q0 corresponding to the current state is applied, a drain to which the third current level I is applied, and the output terminal of the second PMOS transistor MP2 from which the third current level I is output In the output circuit 246, if the state signals Q1 and Q0 received from the data state machine 220 are (0, 0), both the first and second NMOS transistors MN1 and NM2 are turned off, and thus the current level of the current I_OUT flowing through the output terminal of the output circuit 246 has the second current level "0." If the state signals Q1 and Q0 received from the data state machine 220 are (1, 1), both the first and second NMOS transistors MN1 and NM2 are turned on, and thus a current level of the current I_OUT flowing through the output terminal of the output circuit 246 has the first current level "2I."

If the state signals Q1 and Q0 received from the data state machine 220 are (0, 1), the first NMOS transistor MN1 is turned off and the second NMOS transistor MN2 is turned on, and thus a current level of the current I_OUT flowing through the output terminal of the output circuit 246 has the third current level "I."

Consequently, if both the first state signal Q1 and the second state signal Q0 received from the data state machine 220 have "1," the encoder 200 outputs the first current level 2I corresponding to a HIGH state. If both the first state signal Q1 and the second state signal Q0 received from the data state machine 220 have "0," the encoder 200 outputs the second current level 0 corresponding to a LOW state.

In contrast, if the first state signal Q1 and the second state signal Q0 received from the data state machine 220 are different from each other, that is, the first state signal Q1 is "0" and the second state signal Q0 is "1," the encoder 200 outputs the third current level I corresponding to the MIDDLE state.

The encoder 200 shown in FIG. 5 has a configuration such as that described above. Accordingly, the encoder 200 may adjust the amount of current of the current mode circuit of the current generator 240 to any one of the first to third current levels "2I," "0," and "I" in response to the state signals Q1 and Q0, that is, the output values of the data state machine 220.

Figure 6:
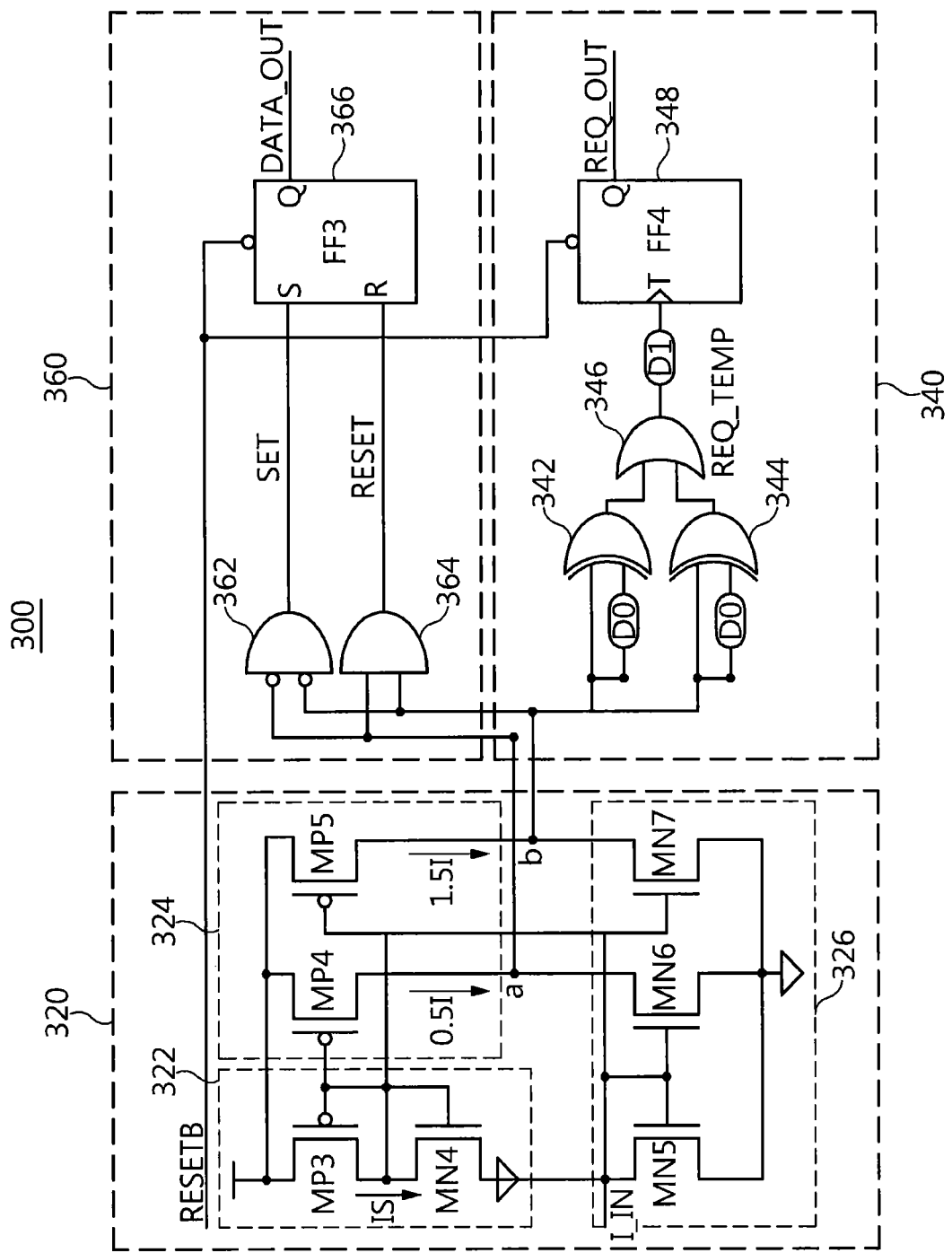
FIG. 6 is a circuit diagram showing an example of the internal configuration of the decoder of the data reception apparatus according to an embodiment of the present invention.

FIG. 6 is a circuit diagram showing an example of the internal configuration of the decoder 300 of the data reception apparatus according to an embodiment of the present invention.

The decoder 300 receives the input current signal encoded by the encoder 200 using the FSM, internally generates voltage values corresponding to the three types of logic states using the generated reference current, and restores the request signal and the data signal based on the generated voltage values.

Referring to FIG. 6, the decoder 300 includes a current detector 320, a request signal restoration unit 340, and a data signal restoration unit 360.

The current detector 320 receives the output current signal I_OUT as the input current signal I_IN from the encoder 200 according to the 2-phase DI transmission method, and converts a current level of the input current signal I_IN into a voltage mode signal.

The request signal restoration unit 340 restores the input request signal REQ_IN in response to the voltage mode signal of the current detector 320, and generates the restored input request signal REQ_IN as the output request signal REQ_OUT.

The data signal restoration unit 360 restores the input data signal DATA_IN in response to a signal internally generated by the request signal restoration unit 340 and the voltage mode signal, and generates the restored input data signal DATA_IN as the output data signal DATA_OUT. Here, the restored input data signal DATA_IN may have an NRZ form divided into the binary value "0" and the binary value "1" on the basis of a point of time at which the restored input request signal REQ_IN transitions.

The decoder 300 will now be described in detail.

First, the current detector 320 includes a current source 322 for the decoder, a current mirror circuit 324 for the decoder, an input current mirror circuit 326, and first and second output nodes a and b.

The current source 322 for the decoder generates a constant current Is. The current mirror circuit 324 for the decoder generates a first reference current 0.5I and a specific current-level second reference current 1.5I which are necessary to detect the current level of the input current signal I_IN, received from the encoder 200, in response to the current level of the constant current Is of the current source 322 for the decoder. The input current mirror circuit 326 performs subtraction on the first reference current 0.5I and the second reference current 1.5I, generated by the current mirror circuit 324 for the decoder, in response to the current level of the input current signal I_IN received from the encoder 200. The output nodes a and b detect the differential current between the first reference current 0.5I and the second reference current 1.5I, and restore the detected differential current as the voltage mode signal.

The current detector 320 will now be described in detail.

First, the current source 322 for the decoder includes a third PMOS transistor MP3 and a fourth NMOS transistor MN4 which are connected in series between the voltage source and the ground. Here, the current source 322 for the decoder has the same configuration and function as the current source 242 for the encoder, which has been described with reference to FIG. 5. Accordingly, a detailed description thereof is omitted here.

The current mirror circuit 324 for the decoder includes a fourth PMOS transistor MP4 and a fifth PMOS transistor MP5. The current mirror circuit 324 for the decoder has the same configuration and function as the current mirror circuit 244 for the encoder, which has been described with reference to FIG. 4. Accordingly, a detailed description thereof is omitted here. However, the current mirror circuit 324 for the decoder is different from the current mirror circuit 244 for the encoder in that the first reference current 0.5I is copied to the drain of the fourth PMOS transistor MP4 and the second reference current 1.5I is copied to the drain of the fifth PMOS transistor MP5.

The input current mirror circuit 326 includes fifth, sixth, and seventh MNOS transistors MN5, MN6, and MN7. The input current signal I_IN received from the encoder 200 is applied to the drain and gate of the fifth NMOS transistor NM5, and the source of the fifth NMOS transistor NM5 is connected to the ground. The first reference current 0.5I received from the current mirror circuit 324 for the decoder is applied to the drain of the sixth NMOS transistor MN6 via the first output node a, the input current signal I_IN is applied to the gate of the sixth NMOS transistor MN6, and the source of the sixth NMOS transistor MN6 is connected to the ground. The second reference current 1.5I received from the current mirror circuit 324 for the decoder is applied to the drain of the seventh NMOS transistor MN7 via the second output node b, the input current signal I_IN is applied to the gate of the seventh NMOS transistor MN7, and the source of the seventh NMOS transistor MN7 is connected to the ground.

As described above, the drain of the fourth PMOS transistor MP4 and the drain of the fifth PMOS transistor MP5 are connected to the drain of the sixth NMOS transistor MN6 and the drain of the seventh NMOS transistor MN7, respectively, through the first and the second output nodes a and b, so that the input current mirror circuit 326 forms a kind of current comparator circuit. That is, in the fifth PMOS transistor MP5, the sixth NMOS transistor MN6, and the seventh NMOS transistor MN7 forming the input current mirror circuit 326, an input current is copied to the drains of the sixth NMOS transistor MN6 and the seventh NMOS transistor MN7, and the input current is compared with each of the first reference current 0.5I and the second reference current 1.5I, generated by the fourth PMOS transistor MP4 and the fifth PMOS transistor MP5, at the first and the second output nodes a and b.

The input current mirror circuit 326 detects the current level of the input current signal I_IN from the differential current between the input current signal I_IN encoded into the first to third current levels 2I, 0, and I and the first reference current 0.5I and the second reference current 1.5I generated by the current mirror circuit 324 for the decoder. Accordingly, the potential state of the first and second output nodes a and b transitions depending on a difference between the input current signal I_IN, and the first reference current 0.5I and the second reference current 1.5I, and an original voltage level may be restored based on the transitioned potential state of the first and second output nodes a and b.

If the input current signal I_IN has the second current level 0, current is not pulled at the drains of the sixth and the seventh NMOS transistors MN6 and MN7 of the input current mirror circuit 326, and thus both the first and second output nodes a and b have a potential state of logic "1."

If the input current signal I_IN has the third current level I, the first reference current 0.5I should be used in order for the drain of the sixth NMOS transistor MN6 to pull the third current level I. Accordingly, the first output node a is indicative of a potential state of logic "1," but the second output node b is indicative of a potential state of logic "1" because there is the differential current.

If the input current signal I_IN has the first current level 2I, both the first and second output nodes a and b are indicative of a potential state of logic "0."

The request signal restoration unit 340 and the data signal restoration unit 360 restore the input request signal REQ_IN and the input data signal DATA_IN into the output request signal REQ_OUT and the output data signal DATA_OUT, respectively, using the potential states of the first and second output nodes a and b which vary in response to a current level of the input current signal I_IN.

The request signal restoration unit 340 generates a pulse waveform req_temp having an amplitude corresponding to a period preset by delays D0, by detecting a transition in the voltage of the first and second output nodes a and b. A transition in the voltage of the first and second output nodes a and b means that the transmission of data is once completed, and thus a fourth flip-flop 348 may restore a 2-phase request signal using the generated pulse waveform. This will now be described in detail.

The request signal restoration unit 340 generates a periodic temp request signal REQ_TEMP and the request signal REQ_OUT, restored from the input request signal REQ_IN, by detecting a variation in the potential state of the first and second output nodes a and b. For this purpose, the request signal restoration unit 340 includes a first exclusive-OR (XOR) gate 342 for receiving the logic state of the first output node a and the logic state of the first output node a delayed by a delay D0 by a preset time, a second XOR gate 344 for receiving the logic state of the first output node a and the logic state of the second output node b delayed by the delay D0 by a preset time, a second OR gate 346 for outputting the temp request signal REQ_TEMP by performing an OR operation on the output value of the first XOR gate 342 and the output value of the second XOR gate 344, and a fourth flip-flop FF4 348 for outputting the output request signal REQ_OUT in response to the temp request signal REQ_TEMP delayed by a delay D1 by a preset time. Here, the fourth flip-flop 348 may be a T flip-flop.

The data signal restoration unit 360 restores a data signal based on a transition in the voltage of the first and second output nodes a and b according to the input current level. Table 2 shows restored data signals and the binary data values of the first and second output nodes a and b according to the input current levels.

TABLE 2

| INPUT CURRENT LEVEL | BINARY DATA VALUES (a, b) | DATA SIGNAL |
|---|---|---|
| 0 | (1, 1) | 0 |
| I | (0, 1) | previous data |
| 2I | (0, 0) | 1 |

In Table 2, when both the binary data values of the first and the second output nodes a and b are "1," the data signal "0" is simply generated. When both the binary data values of the first and second output nodes a and b are "0," the data signal "1" is simply generated. Accordingly, the data signal may be restored by using an RS latch (i.e., the third flip-flop FF3 366).

In an embodiment, the data signal restoration unit 360 may generate a set signal by performing a first operation on the first and second logic voltages of the first and second output nodes a and b, generate a reset signal by performing a second operation on the first and second logic voltages, and generate the output data signal DATA_OUT by applying the generated set signal and the generate reset signal to the RS latch. Here, the first operation may include an AND operation which is performed on an inverted signal of the first logic voltage and an inverted signal of the second logic voltage, the second operation may include an AND operation which is performed on the first logic voltage and the second logic voltage, and the data signal restoration unit 360 may include a second AND gate 362 and a third AND gate 364 for performing the first operation and the second operation.

Figure 7:
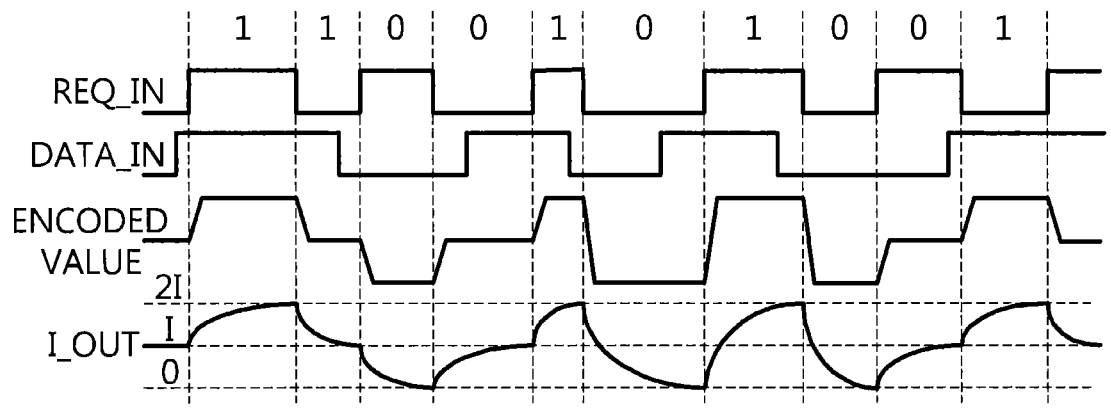
FIG. 7 is a diagram illustrating a phenomenon in which the output current signal of the encoder is hung down along a long wire.

FIG. 7 is a diagram illustrating a phenomenon in which the output current signal of the encoder 200 is hung down along a long wire.

A current output from the encoder 200 shown in FIG. 5 is transferred to the decoder 300 over the wire having a physical length. When current is transferred over a relatively long wire, it takes some time for current that can be detected at the input terminal of the decoder 300 to be charged or discharged because of the presence of resistance and capacitance components in the wire. Values encoded as shown in FIG. 7 are represented by three-step current levels. When the output current I_OUT passes through the wire, it takes some time for the output current I_OUT to reach each of the three-step current levels depending on the length of the wire. This inevitably delays a variation in the voltage of the first and second output nodes a and b of the decoder 300 of FIG. 6, which means that the time taken to restore the data signal and the request signal is delayed. Accordingly, in order to improve performance, the time that it takes to charge or discharge desired current should be reduced. For this reason, the encoder 200 of the data transmission apparatus according to another embodiment of the present invention may further include a current addition/subtraction prediction unit and a current addition/subtraction unit for previously charging and discharging a small amount of current not exceeding the original amount of encoded current of the output current I_OUT of the output terminal, before the drain of the current mirror circuit 244 for the encoder of the current generator 240 of FIG. 5 is charged or discharged with the amount of encoded current.

Figure 8:
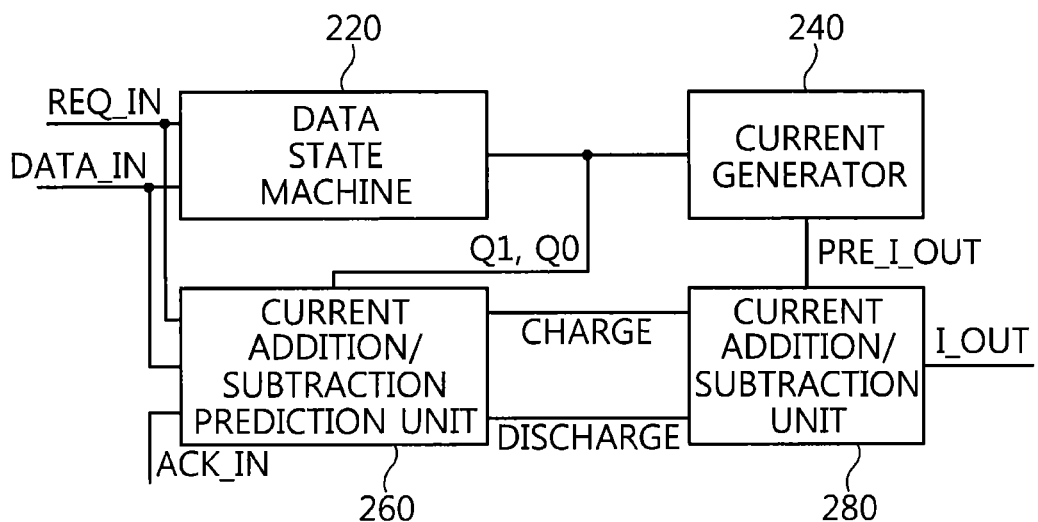
FIG. 8 is a block diagram showing an example of the internal configuration of the encoder of the data transmission apparatus according to another embodiment of the present invention.

FIG. 8 is a block diagram showing an example of the internal configuration of the encoder of the data transmission apparatus according to another embodiment of the present invention.

FIG. 8 shows the encoder 200 which further includes a current addition/subtraction prediction unit 260 and a current addition/subtraction unit 280 in order to overcome a phenomenon in which the output current signal of the encoder is hung down along a long wire, such as that shown in FIG. 7. A data state machine 220 and current generator 240 of FIG. 8 may be the same as those of FIG. 5.

A process in which the amount of current is changed in the encoder 200 of FIG. 5 includes five steps, including the stabilization of the data signal DATA_IN, a variation in the request signal REQ_IN, a variation in the state signals Q1 and Q0, the switching on and off of the current generator, and the start of encoded current output. Here, under the bundled data assumption, the data signal DATA_IN always varies before the request signal REQ_IN requesting the variation of the state signal varies. Before the process including the five steps is completed, the current addition/subtraction prediction unit 260 and the current addition/subtraction unit 280 may detect only a variation in the data signal DATA_IN, estimate a next state in advance, and then perform charging with or the discharging of a small amount of current.

The current addition/subtraction prediction unit 260 generates a charging pulse signal CHARGE or a discharging pulse signal DISCHARGE based on the response signal ACK_IN in response to the request signal REQ_IN, the data signal DATA_IN, the state signals Q1 and Q0 corresponding to the current state, and the request signal and the data signal restored by the data reception apparatus.

The current addition/subtraction unit 280 controls current generated by the current generator 240 by previously performing the current charging or discharging operation in response to the charging pulse signal CHARGE or the discharging pulse signal DISCHARGE. Examples of the functions and internal configurations of the current addition/subtraction prediction unit 260 and the current addition/subtraction unit 280 will now be described with reference to the accompanying drawings.

Figure 9:
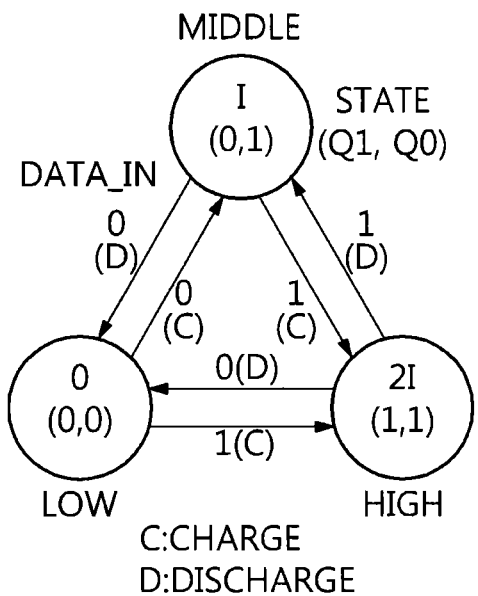
FIG. 9 is a state transition diagram showing a current charging or discharging operation based on the state transition of the encoder of the data transmission apparatus according to another embodiment of the present invention.

FIG. 9 is a state transition diagram showing the current charging or discharging operation based on the state transition of the encoder of the data transmission apparatus according to another embodiment of the present invention.

The state transition diagram of FIG. 4 in which the state transitions at a point of time at which the request signal REQ_IN transitions in response to the input data signal DATA_IN will now be described. As shown in FIG. 9, in a HIGH state 2I and a LOW state 0, the current discharging and charging operations are performed in a transition to a next state irrespective of the input data signal DATA_IN. In the MIDDLE state I, the current charging operation is performed when input data is "1," and the current discharging operation is performed when the input data is "0." Table 3 shows the current charging or discharging operation according to the state transition of the encoder 200.

TABLE 3

| STATE TRANSITION | DATA_IN | OPERATION |
|---|---|---|
| I -> 0 | 0 | discharging |
| I -> 2I | 1 | charging |
| 2I -> 0 | 0 | discharging |
| 2I -> I | 1 | discharging |
| 0 -> I | 0 | charging |
| 0 -> 2I | 1 | charging |

As shown in Table 3, when the MIDDLE state I transitions to a LOW state 0 or a HIGH state 2I, the current discharging and charging operations may be previously performed by detecting only a variation in the input data signal DATA_IN. This means that the current discharging and charging operations may be performed before the process including the five steps described above. In a HIGH state 2I or a LOW state 0, the current discharging and charging operations may be directly performed only after the current cycle has been terminated, irrespective of input data. Whether the current cycle is terminated may be determined based on the input response signal ACK_IN of the data receiver 400 of FIG. 3.

Figure 10:
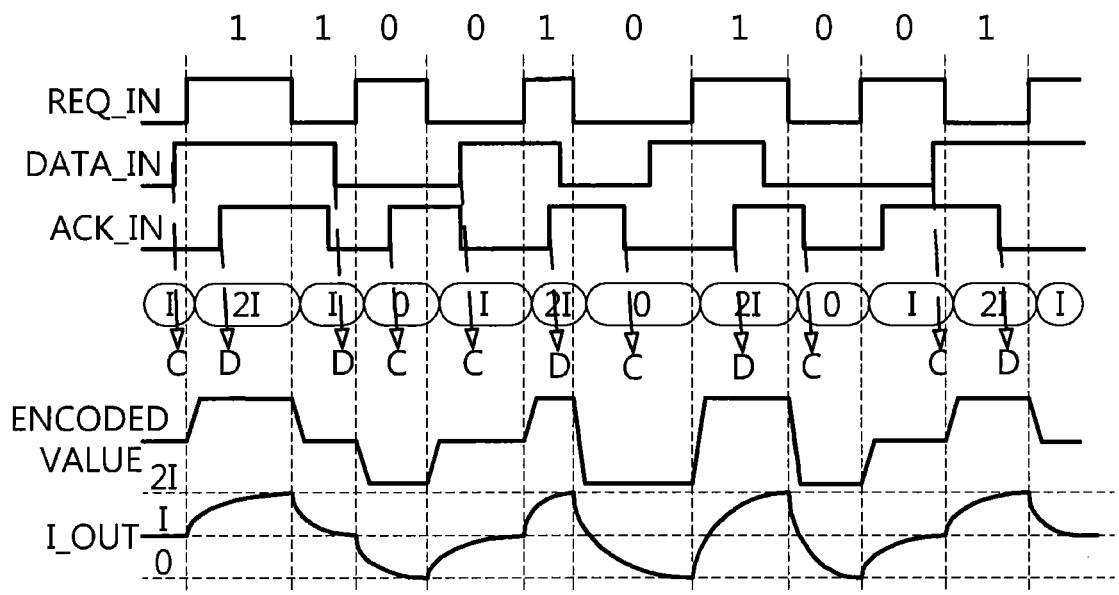
FIG. 10 is a timing diagram of internal signals of the encoder illustrating a current charging or discharging operation based on the state transition of the encoder of the data transmission apparatus according to another embodiment of the present invention.

FIG. 10 is a timing diagram of the internal signals of the encoder illustrating the current charging or discharging operation based on the state transition of the encoder of the data transmission apparatus according to another embodiment of the present invention.

Referring to FIG. 10, the conditions for the prediction of current charging or discharging based on the state transition of the encoder of the data transmission apparatus according to another embodiment of the present invention can be seen. Table 4 shows the conditions for the prediction of charging or discharging.

TABLE 4

| RELATED STATES | STATE SIGNAL Q1, Q0 | PREDICTION CONDITIONS | OPERATION |
|---|---|---|---|
| 2I | (1, 1) | variation in ACK_IN | discharging |
| 0 | (0, 0) | variation in ACK_IN | charging |
| I | (0, 1) | rising of DATA_IN | charging |
|  |  | falling of DATA_IN | discharging |

As shown in Table 4, in a HIGH state 2I or a LOW state 0, the current discharging or charging operation starts only when there is a variation in the response signal ACK_IN.

Furthermore, when the rising of the input data signal DATA_IN is detected in the MIDDLE state I, it means that the MIDDLE state I transitions to a HIGH state 2I, and thus the current charging operation is performed. When the falling of the input data signal DATA_IN is detected in the MIDDLE state I, it means that the MIDDLE state I transitions to a LOW state 0, and thus the current discharging operation is performed.

The current addition/subtraction prediction unit 260 and the current addition/subtraction unit 280 will now be described with reference to FIG. 8 again. The current addition/subtraction prediction unit 260 generates a charging or discharging pulse signal as described above based on the request signal REQ_IN and the data signal DATA_IN, that is, the inputs of the data state machine 220, the state signals Q1 and Q0, that is, the outputs of the data state machine, and the response signal ACK_IN of FIG. 3. The current addition/subtraction unit 280 generates final current for improved performance by controlling the output current, generated by the current generator 240, in response to the charging or discharging pulse signal.

Figure 11:
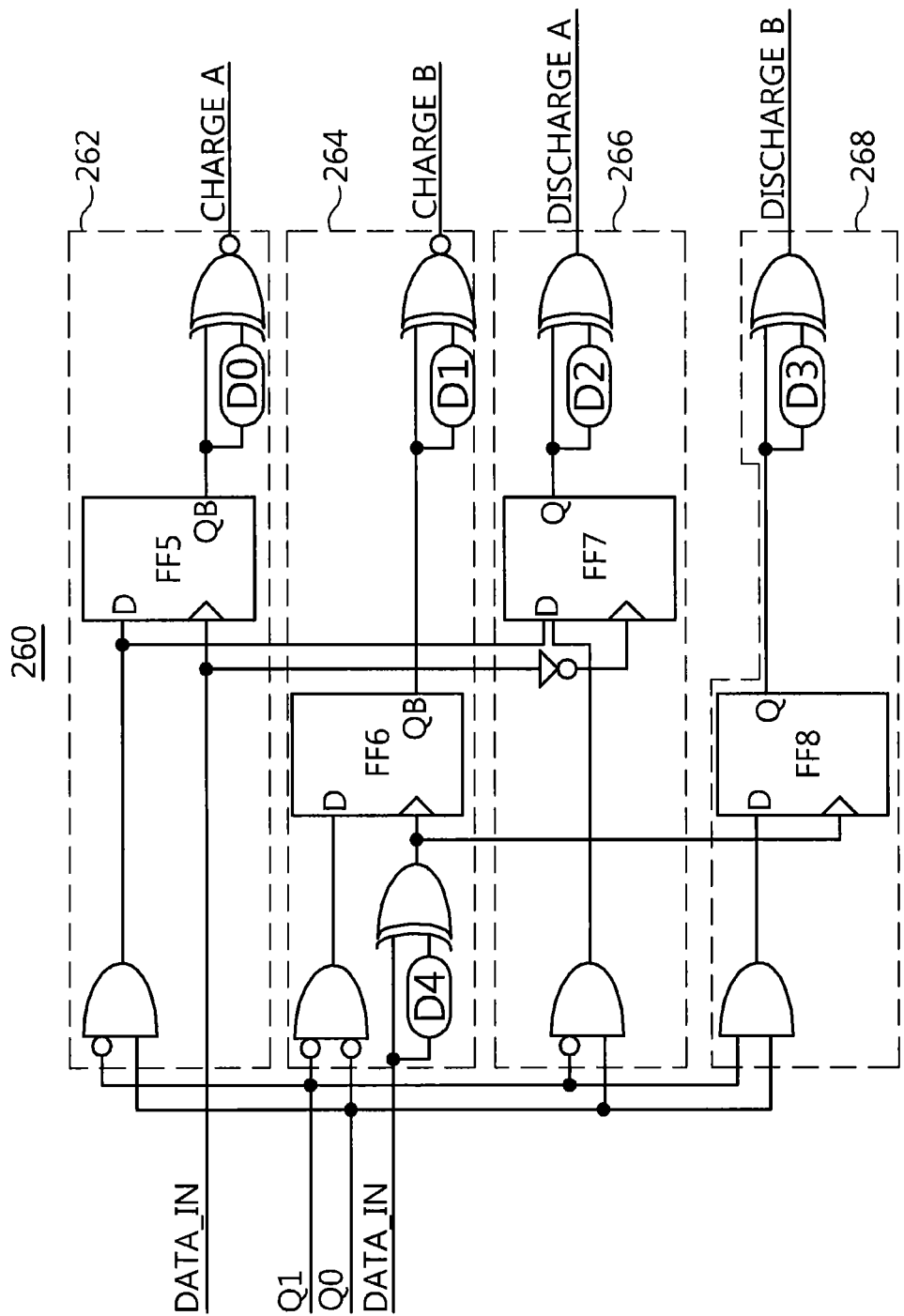
FIG. 11 is a circuit diagram showing an example of the internal configuration of the current addition/subtraction prediction unit of the encoder of the data transmission apparatus according to another embodiment of the present invention.

FIG. 11 is a circuit diagram showing an example of the internal configuration of the current addition/subtraction prediction unit of the encoder of the data transmission apparatus according to another embodiment of the present invention.

Referring to FIG. 11, the current addition/subtraction prediction unit 260 of the encoder of the data transmission apparatus according to another embodiment of the present invention includes a first charging prediction unit 262, a second charging prediction unit 264, a first discharging prediction unit 266, and a second discharging prediction unit 268. The first charging prediction unit 262, the second charging prediction unit 263, the first discharging prediction unit 264, and the second discharging prediction unit 266 correspond to the respective prediction conditions corresponding to the third, second, fourth, and first lines of Table 4.

That is, when receiving the binary value "1" in the MIDDLE state I, the first charging prediction unit 262 generates the charging pulse signal. When receiving the response signal ACK_IN in a LOW state 0, the second charging prediction unit 264 generates the charging pulse signal. When receiving the binary value "0" in the MIDDLE state I, the first discharging prediction unit 266 generates the discharging pulse signal. When receiving the response signal ACK_IN in a HIGH state 2I, the second discharging prediction unit 268 generates the discharging pulse signal.

The configuration of the current addition/subtraction prediction unit 260 will now be described in detail.

An XOR gate attached to the response signal ACK_IN and a delay device D4 are logics for generating a rising pulse whenever a variation in the response signal ACK_IN is detected.

The first charging prediction unit 262 includes an AND gate for performing an AND operation on an inverted signal of the first state signal Q1 and the second state signal Q0, a fifth flip-flop FF5 for receiving a result of the AND operation of the AND gate and the data signal DATA_IN as a clock signal and outputting an inverted output value, and an XNOR gate and a delay device D0 for generating a pulse signal having a width corresponding to the delay time of the delay device D0. The second charging prediction unit 264 includes an AND gate for performing an AND operation on an inverted signal of the first state signal Q1 and an inverted signal of the second state signal Q0, a sixth flip-flop FF6 for receiving a result of the AND operation of the AND gate and a detected rising pulse of the response signal ACK_IN as a clock signal and generating an inverted output value, and an XNOR gate and a delay device D1 for generating a pulse signal having a width corresponding to the delay time of the delay device D1.

Furthermore, the third charging prediction unit 266 includes an AND gate for performing an AND operation on an inverted signal of the first state signal Q1 and the second state signal Q0, a seventh flip-flop FF7 for receiving a result of the AND operation of the AND gate and an inverted signal of the data signal DATA_IN as a clock signal and outputting an output value, and an XOR gate and a delay device D2 for generating a pulse signal having a width corresponding to the delay time of the delay device D2. The fourth charging prediction unit 268 includes an AND gate for performing an AND operation on the first state signal Q1 and the second state signal Q0, an eighth flip-flop FF8 for receiving a result of the AND operation of the AND gate and a detected rising pulse of the response signal ACK_IN as a clock signal and outputting an output value, and an XOR gate and a delay device D3 for generating a pulse signal having a width corresponding to the delay time of the delay device D3.

Figure 12:
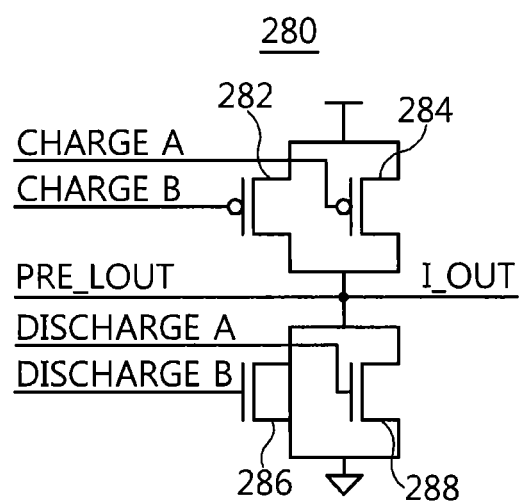
FIG. 12 is a circuit diagram showing an example of the internal configuration of the current addition/subtraction unit of the encoder of the data transmission apparatus according to another embodiment of the present invention.

FIG. 12 is a circuit diagram showing an example of the internal configuration of the current addition/subtraction unit 280 of the encoder 300 of the data transmission apparatus according to another embodiment of the present invention.

Referring to FIG. 12, the current addition/subtraction unit 280 of the encoder 300 of the data transmission apparatus according to another embodiment of the present invention charges or discharges a small amount of current through the preliminary output current PRE_I_OUT of the current generator 240 in response to the four types of charging or discharging pulse signals of the current addition/subtraction prediction unit 260, before the current generator 240 generates the original current. For this purpose, the current addition/subtraction unit 280 includes two transistors 282 and 284 for charging and two transistors 286 and 288 for discharging. Here, in order to prevent the data transmission apparatus 200 from malfunctioning, the current addition/subtraction unit 280 may perform charging with or the discharging of current having a level lower than that of current generated by the current generator 240. That is, the charging or discharging current of the current addition/subtraction unit 280 may be set to a value which satisfies "0<=the amount of current<I." In order to control the charging or discharging current, each of the transistors of the current addition/subtraction unit 280 may be controlled or the delay time of each of the delay devices D0 to D3 of the current addition/subtraction prediction unit 260 may be controlled.

As described above, the present invention may provide the data transmission apparatus, the data reception apparatus, and the data transmission method which are capable of simplifying the circuit structure of a decoder because an assumption for the time related to a request signal and a data signal is not necessary and an additional logic for generating a clock signal for the decoder is not necessary by using an FSM logic without storing a state through a delay device.

Furthermore, the data transmission apparatus according to another aspect of the present invention may reduce latency due to resistance and capacitance values in a long wire by estimating the addition or subtraction of current in the form of an input data signal and the current state.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A data transmission apparatus, comprising:
a data transmitter for generating a request signal and a data signal having a Non-Return-to-Zero (NRZ) format that is divided into a binary value "0" and a binary value "1" on a basis of a transition point of the request signal; and
an encoder for receiving the request signal and the data signal and converting the binary value "0," the binary value "1" and a current binary value identical to a previous binary value into respectively different current levels, by performing an operation on the request signal and the data signal using a Finite State Machine (FSM) which is generated by allocating a LOW state indicative of the binary value "0," a HIGH state indicative of the binary value "1" and a MIDDLE state indicative of the current binary value identical to the previous binary value to specific state signals, wherein the encoder comprises:
a data state machine for outputting a state signal corresponding to a current state and corresponding to one of the LOW state indicative of the binary value "0," the HIGH state indicative of the binary value "1," and the MIDDLE state indicative of the current binary value identical to the previous binary value using the data signal and the request signal; and
a current generator for outputting one of the first to third current levels in response to the state signal corresponding to the current state.

2. The data transmission apparatus of claim 1, wherein:
the respectively different current levels comprise a first current level, a second current level lower than the first current level, and a third current level lower than the first current level but higher than the second current level; and
the encoder outputs the first current level when sending the binary value "1," outputs the second current level when sending the binary value "0," and outputs the third current level when sending the data signal having the current binary value identical to the previous binary value.

3. The data transmission apparatus of claim 1, wherein the data state machine comprises:
a first flip-flop for outputting a first state signal of the state signals, corresponding to the current state, by sampling results of an AND operation performed on the data signal and an inverting output signal of the first flip-flop on a basis of the transition point of the request signal;
a second flip-flop for outputting a second state signal of the state signals, corresponding to the current state, by sampling results of an OR operation performed on the data signal and an inverting output signal of the second flip-flop on a basis of the transition point of the request signal;
a first AND gate for performing an AND operation on the data signal and the inverting output signal of the first flip-flop; and
a first OR gate for performing an OR operation on the data signal and the inverting output signal of the second flip-flop.

4. The data transmission apparatus of claim 3, wherein the first and second flip-flops operate using a dual edge-triggered method which samples the results of the AND operation performed on the data signal and the inverting output signal of the first flip-flop and the results of the OR operation performed on the data signal and the inverting output signal of the second flip-flop at rising and falling edges of the request signal.

5. The data transmission apparatus of claim 1, wherein the current generator comprises:
a current source for the encoder for generating a constant current;
a current mirror circuit for the encoder for generating the third current level using the generated constant current; and
an output circuit for selectively outputting any one of the first to third current levels in response to the state signal corresponding to the current state;
wherein the first current level is twice the third current level.

6. The data transmission apparatus of claim 5, wherein the output circuit comprises:
a first NMOS transistor comprising a gate to which the first state signal of the state signals corresponding to the current state is applied, a drain to which the second current level is applied, and a source connected to an output terminal for outputting the second current level; and a second NMOS transistor comprising a gate to which the second state signal of the state signals corresponding to the current state is applied, a drain to which the second current level is applied, and a source connected to an output terminal for outputting the second current level.

7. The data transmission apparatus of claim 1, further comprising:

a current addition/subtraction prediction unit for generating a charging pulse signal or a discharging pulse signal based on a response signal sent in response to the request signal, the data signal, the state signal corresponding to the current state, and a request signal and a data signal restored by the data reception apparatus; and a current addition/subtraction unit for controlling current generated by the current generator by previously performing charging or discharging in response to the charging pulse signal or the discharging pulse signal.

8. The data transmission apparatus of claim 7, wherein the current addition/subtraction prediction unit comprises:

a first charging prediction unit for generating the charging pulse signal when the binary value "1" is received in the MIDDLE state;

a second charging prediction unit for generating the charging pulse signal when the response signal is received in a LOW state;

a first discharging prediction unit for generating the discharging pulse signal when the binary value "0" is received in the MIDDLE state; and a second discharging prediction unit for generating the discharging pulse signal when the response signal is received in a HIGH state.

9. The data transmission apparatus of claim 7, wherein the current addition/subtraction unit charges or discharges the current having a level lower than that of the current generated by the current generator.

10. A data reception apparatus, comprising:

a decoder for receiving an input current signal encoded using an FSM generated by allocating a LOW state indicative of the binary value "0," a HIGH state indicative of the binary value "1," and a MIDDLE state indicative of a current binary value identical to a previous binary value to specific state signals, generating voltage values corresponding to the three types of logic states using internally generated reference current, and restoring a request signal and a data signal based on the generated voltage values; and a data receiver for sending a response signal to a receiving side in response to the restored request signal and the restored data signal, wherein the decoder comprises:

a current detector for performing subtraction on a current level of the internally generated reference current and a current level of the received input current signal and outputting first and second logic voltages corresponding to the differential current level;

a request signal restoration unit for generating a periodic delay temp request signal using the first and second logic voltages, delaying the delay temp request signal, and generating the request signal having a logic level varying at each point of time at which the delay temp request signal rises; and a data signal restoration unit for generating a set signal by performing a first operation on the first and second logic voltages, generating a reset signal by performing a second operation on the first and second logic voltages, and generating the data signal by applying the generated set signal and the generated reset signal to an RS latch.

11. The data reception apparatus of claim 10, wherein the restored data signal has an NRZ format that is divided into the binary value "0" and the binary value "1" on a basis of a transition point of the restored request signal.

12. The data reception apparatus of claim 10, wherein:

the input current signal has one of a first current level corresponding to a HIGH state, a second current level corresponding to a LOW state, and a third current level corresponding to the MIDDLE state; and the second current level is lower than the first current level, and the third current level is lower than the first current level but higher than the second current level.

13. The data reception apparatus of claim 10, wherein the request signal restoration unit comprises:

a first XOR gate for performing an exclusive-OR (XOR) operation on the first logic voltage and the first logic voltage delayed by a specific time;

a second XOR gate for performing an XOR operation on the second logic voltage and the second logic voltage delayed by the specific time;

a second OR gate for outputting the delay temp request signal by performing an OR operation on an output value of the first XOR gate and an output value of the second XOR gate;

a delay for delaying the delay temp request signal; and a T-flip-flop for generating the request signal having a logic level varying at each point of time at which the delay temp request signal rises.

14. The data reception apparatus of claim 10, wherein:

the first operation comprises an AND operation which is performed on an inverted signal of the first logic voltage and an inverted signal of the second logic voltage; and the second operation comprises an AND operation which is performed on the first logic voltage and the second logic voltage.

15. A data transmission method, comprising:

receiving a request signal and a data signal having an NRZ format that is divided into a binary value "0" and a binary value "1" on a basis of a transition point of the request signal;

performing an operation on the request signal and the data signal using an FSM generated by allocating a LOW state indicative of the binary value "0," a HIGH state indicative of the binary value "1," and a MIDDLE state indicative of a current binary value identical to a previous binary value to specific state signals, and coding the binary value "1" into a first current level, coding the binary value "0" into a second current level lower than the first current level, and coding the current binary value identical to the previous binary value into a third current level lower than the first current level but higher than the second current level based on results of the operation;

receiving any one current level of the first to third current levels;

detecting the any one current level and generating first and second logic voltages based on the detected current level; and restoring the data signal and the request signal by performing an operation on the first and second logic voltages, wherein the coding comprises:

outputting a state signal corresponding to a current state and corresponding to one of the LOW state indicative of the binary value "0," the HIGH state indicative of the binary value "1," and the MIDDLE state indicative of the current binary value identical to the previous binary value using the data signal and the request signal; and
outputting one of the first to third current levels in response to the state signal corresponding to the current state.

16. The data transmission method of claim 15, wherein the any one current level is received according to a 2-phase DI data transmission method.

* * * * *